United States Patent
Takeda et al.

(10) Patent No.: US 12,429,498 B2
(45) Date of Patent: Sep. 30, 2025

(54) INSPECTION DEVICE

(71) Applicant: Mitsubishi Electric Corporation, Tokyo (JP)

(72) Inventors: Masafumi Takeda, Tokyo (JP); Tetsuhiro Fukao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 111 days.

(21) Appl. No.: 18/560,694

(22) PCT Filed: Jun. 23, 2021

(86) PCT No.: PCT/JP2021/023702
§ 371 (c)(1),
(2) Date: Nov. 14, 2023

(87) PCT Pub. No.: WO2022/269783
PCT Pub. Date: Dec. 29, 2022

(65) Prior Publication Data
US 2024/0288469 A1 Aug. 29, 2024

(51) Int. Cl.
*G01R 1/067* (2006.01)
(52) U.S. Cl.
CPC ................ *G01R 1/067* (2013.01)
(58) Field of Classification Search
None
See application file for complete search history.

(56) References Cited

U.S. PATENT DOCUMENTS

| | | | | |
|---|---|---|---|---|
| 5,585,736 | A * | 12/1996 | Hshieh | G01R 1/067 324/754.04 |
| 6,646,455 | B2 * | 11/2003 | Maekawa | G01R 3/00 451/41 |
| 7,975,901 | B2 * | 7/2011 | Maeda | B23K 20/007 228/180.5 |

(Continued)

FOREIGN PATENT DOCUMENTS

| | | |
|---|---|---|
| JP | S56-017563 U | 2/1981 |
| JP | H02-168175 A | 6/1990 |

(Continued)

OTHER PUBLICATIONS

International Search Report issued in PCT/JP2021/023702; mailed Aug. 24, 2021.

*Primary Examiner* — Richard Isla
(74) *Attorney, Agent, or Firm* — Studebaker Brackett PLLC

(57) ABSTRACT

Provided here are: a measuring probe that is to be connected to a terminal pad of a measurement object; a measuring probe that is to be connected to a terminal pad of the measurement object, said terminal pad being electrically conductive with the terminal pad of the measurement object; and a signal source that is connected to both the measuring probe and the measuring probe and that can write or read a signal in or from the measurement object through each of the measuring probe and the measuring probe. Accordingly, it is possible to apply a signal from the signal source to the measurement object even if foreign substances are deposited on one of the measuring probes, without widely setting the measurement area for the measurement object. This reduces the problem of defective contact.

19 Claims, 20 Drawing Sheets

(56) References Cited

U.S. PATENT DOCUMENTS 9,825,000 B1 * 11/2017 Humphrey .............. H01L 24/85
2006/0103396 A1 * 5/2006 Tan ...................... G01R 31/305
324/760.02

FOREIGN PATENT DOCUMENTS

| JP | H07-092234 A | 4/1995 |
| JP | 2004-132727 A | 4/2004 |
| JP | 2008-028343 A | 2/2008 |
| JP | 2010-098197 A | 4/2010 |
| JP | 2017-020965 A | 1/2017 |

* cited by examiner

INSPECTION DEVICE

TECHNICAL FIELD

The present application relates to an inspection device.

BACKGROUND ART

In Patent Document 1, a semiconductor device inspection contactor is disclosed which is a contactor for use in inspection of semiconductor devices and is characterized in that a contact pin to be in contact with a lead terminal of the semiconductor device is configured with paired contactor electrodes that can be electrically conductive with each other through the lead terminal of the semiconductor device. This semiconductor device inspection contactor is applicable to a contactor whose contact portion in contact with the lead terminal of the semiconductor device has a pogo pin structure in which an inner diametral contactor electrode and an outer diametral contactor electrode are arranged to be double-layered inside and outside through a cylindrical insulator, and by which a contact defective state is detected according to a criteria that, if the two inside and outside contactor electrodes are electrically conductive with each other by way of the lead terminal of the semiconductor device, their contact state is determined to be non-defective.

In Patent Document 2, an in-circuit tester including a function of measuring a contact resistance is disclosed. It is an in-circuit tester which includes a power supply pin located on a power-supply side and an earth pin located on an earth side, and in which a first contact and a second contact placed spaced apart from each other are formed on at least one of the power supply pin and the earth pin, said in-circuit tester comprising: a first measurement circuit in which the first contact and the second contact are parallelly arranged to each other, that measures a resistance of a measurement object placed between the power supply pin and the earth pin; a second measurement circuit in which the first contact and the second contact are serially arranged to each other, that measures respective contact resistances between the first and second contacts and the measurement object; and a switching means that selects which one of the first measurement circuit and the second measurement circuit is to be used for measurement. When the contact resistances of the measurement object are proper, an electrical property of the measurement object can be measured without any additional step.

CITATION LIST

Patent Document

Patent Document 1: Japanese Patent Application Laid-open No. H02-168175 (Page 2, Upper-Left Column, Line 5 to Upper-Right Column, Line 16)

Patent Document 2: Japanese Patent Application Laid-open No. 2004-132727 (Paragraphs 0009 to 0024; FIG. 2)

SUMMARY OF THE INVENTION

Problems to be Solved by the Invention

Patent Documents 1, 2 are directed to a method of measuring a contact resistance in such a manner that a measurement object and a contactor composed of plural conductors are connected with each other, to thereby detect a defective contact; however, since the contactor is composed of plural conductors, in order that the plural conductors make contact with the measurement object, the plural conductors are required to be placed on the same plane with respect to the measurement object. Accordingly, there is a problem that it is necessary to widely set a measurement area for the measurement object so that the contactor can be properly connected to the measurement object, and further that when foreign substances are deposited in between the contactor and the measurement object, the measurement object may be determined to be defective, even if it is a non-defective product, because of a defective contact, resulting in reduced throughput.

This application has been made to solve the problem as described above, and an object thereof is to provide an inspection device that includes measuring probes located at different positions signal source, and that writes or read an intended signal in or from a measurement object.

Means for Solving the Problems

An inspection device disclosed in this application is characterized by comprising: a first probe that is to be connected to a first terminal portion of a measurement object; a second probe that is to be connected to a second terminal portion of the measurement object, said second terminal portion being electrically conductive with the first terminal portion of the measurement object; and a signal source that is connected to both the first probe and the second probe and that can write or read a signal in or from the measurement object through each of the first probe and the second probe.

Effect of the Invention

According to this application, since two measuring probes to be connected respectively to the two terminal portions of the measurement object are provided, it is possible to apply a signal from the signal source to the measurement object without the need of widely setting the measurement area for the measurement object, even if foreign substances are deposited on one of the measuring probes. This makes it possible to reduce the problem of defective contact.

MODES FOR CARRYING OUT THE INVENTION

Embodiment 1

Figure 1:
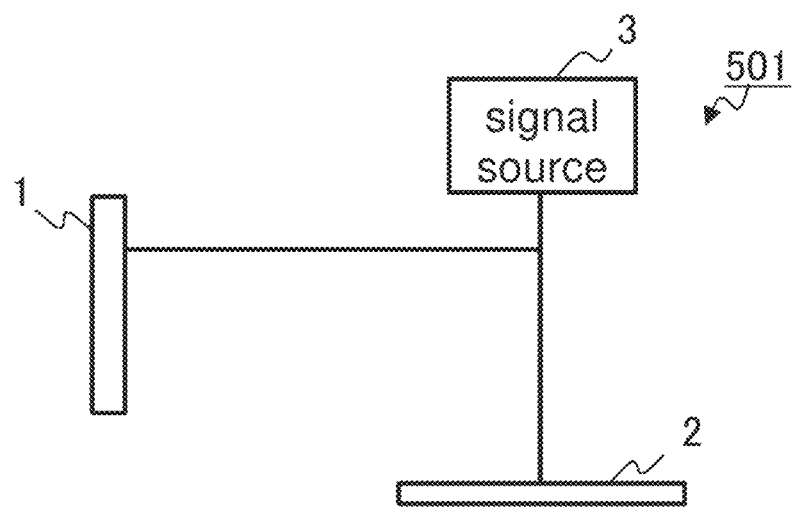
FIG. 1 is a schematic diagram showing a configuration of an inspection device according to Embodiment 1.

FIG. 1 is a schematic diagram showing a configuration of an inspection device 501 according to Embodiment 1 of this application. As shown in FIG. 1, the inspection device 501 is configured with a measuring probe 1 as a first probe, a measuring probe 2 as a second probe, and a signal source 3. The inspection device 501 is characterized in that the measuring probe 1 and the measuring probe 2 are connected respectively to two terminal portions of a measurement object that are placed at different positions but are electrically conductive with each other.

To the signal source 3, the measuring probe 1 and the measuring probe 2 are both connected. The measuring probe 1 and the measuring probe 2 can be individually connected to the measurement object.

Figure 2:
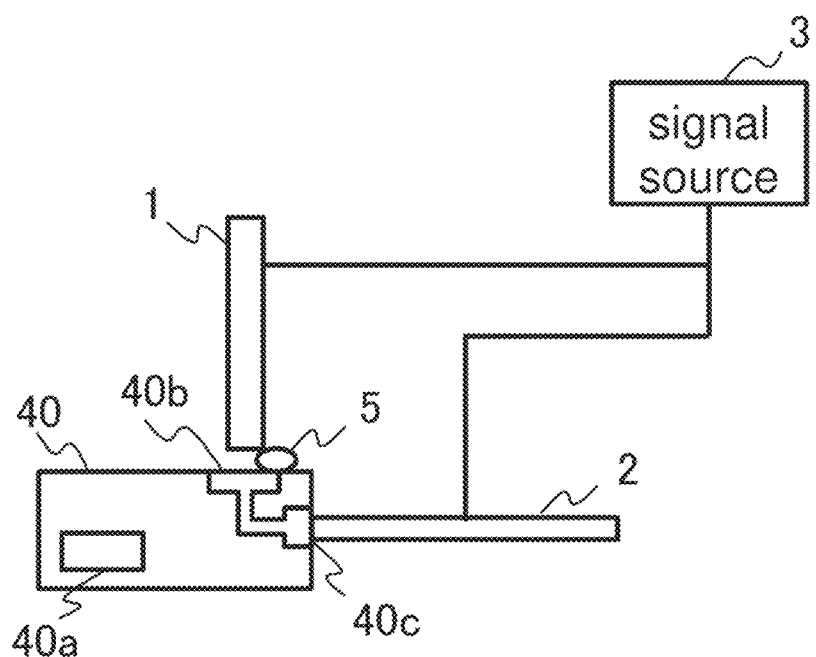
FIG. 2 is a schematic diagram showing a state in which the inspection device according to Embodiment 1 is connected to a measurement object.

FIG. 2 is a schematic diagram showing a state in which the inspection device 501 is connected to a measurement object 40. The measurement object 40 is provided with, in its inside, an OTPROM (One Time Programmable Read Only Memory) 40a and, on its front surface and side surface, a terminal pad 40b as a first terminal portion and a terminal pad 40c as a second terminal portion, respectively, in which the terminal pad 40b and the terminal pad 40c are provided to be electrically conductive with each other.

As shown in FIG. 2, according to the inspection device 501, at the time of the inspection, the measuring probe 1 and the measuring probe 2 are placed on the terminal pad 40b and the terminal pad 40c, respectively, and at this time, even if foreign substances 5 are deposited, for example, in between the measuring probe 1 and the terminal pad 40b, since the measuring probe 2 and the terminal pad 40c are connected to each other, a signal from the signal source 3 will be applied to the measurement object 40 through the measuring probe 2.

Thus, according to this application, an effect is created that suppresses reduction in the yield due to defective contact. In particular, in terms of the fact that program writing is allowed only once for the measurement object 40 provided with the OTPROM 40a, it is possible to suppress reduction in the yield due to failure of the program writing.

Further, if the foreign substances 5 are absent in FIG. 2, since the measuring probe 1 and the terminal pad 40b will be connected to each other, the signal from the signal source 3 after passing through the measuring probe 1 and that after passing through the measuring probe 2 will be applied to the measurement object 40.

According to Patent Documents 1, 2, such a function is provided that measures a contact resistance when the measurement object and the contactor composed of plural conductors are connected to each other, to thereby detect a defective contact. However, since the contactor is composed of plural conductors, in order that the plural conductors make contact with the measurement object, the plural conductors are required to be placed on the same plane with respect to the measurement object. Accordingly, it is necessary to widely set the measurement area for the measurement object correspondingly to the size of the contactor so that the contactor can be properly connected to the measurement object and, if foreign substances are deposited in between the contactor and the measurement object, it is highly likely that all of the plural conductors cannot be connected to the measurement object, resulting in a defective contact.

In contrast, according to this application, since there are provided the measuring probe 1 and the measuring probe 2 that are to be connected to the different terminal pads 40b, 40c of the measurement object 40 that are electrically conductive with each other, it is possible to decrease the measurement area for the measurement object to an area corresponding to one probe (corresponding to one conductor). Furthermore, in terms of positions in the measurement object 40, the terminal pad 40b and the terminal pad 40c can be located three-dimensionally. Thus, even if foreign substances 5 are deposited on one of the measuring probes, a signal from the signal source can be applied to the measurement object. This makes it possible to reduce the problem of defective contact.

As described above, the inspection device 501 according to Embodiment 1 comprises: the measuring probe 1 that is to be connected to the terminal pad 40b of the measurement object 40; the measuring probe 2 that is to be connected to the terminal pad 40c of the measurement object 40, said terminal pad 40c being placed at a position different from, but being electrically conductive with, the terminal pad 40b of the measurement object 40; and the signal source 3 that is connected to both the measuring probe 1 and the measuring probe 2 and that can write or read a signal in or from the measurement object 40 through each of the measuring probe 1 and the measuring probe 2. Thus, it is possible to apply a signal from the signal source to the measurement object without the need of widely setting the measurement area for the measurement object, even if foreign substances are deposited on one of the measuring probes. This makes it possible to reduce the problem of defective contact.

Embodiment 2

In Embodiment 1, the description has been made about a case where inspection is executed regardless of the presence or absence of a defective contact, whereas in Embodiment 2, description will be made about a case where a defective contact is detected before the inspection.

Figure 3:
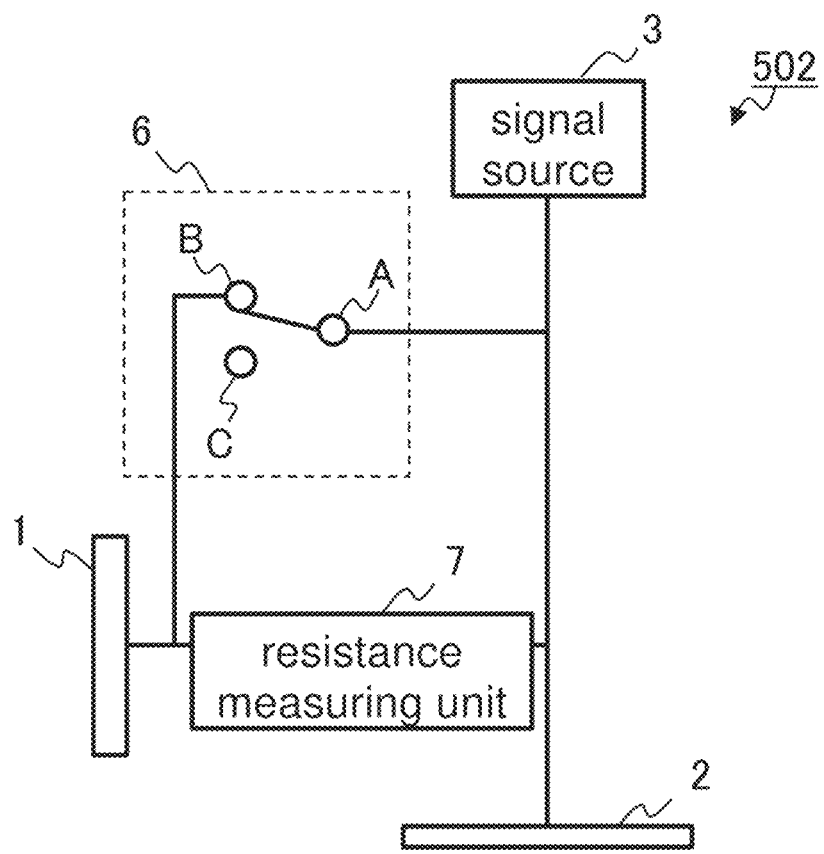
FIG. 3 is a schematic diagram showing a configuration of an inspection device according to Embodiment 2.

FIG. 3 is a schematic diagram showing a configuration of an inspection device 502 according to Embodiment 2 of this application. As shown in FIG. 3, in the inspection device 502, a relay 6 for switching from one of an electrically conductive state (a state in which a terminal A is connected to a terminal B) and a shut-off state (a state in which the terminal A is connected to a terminal C) to the other one of them, and a resistance measuring unit 7 are provided in parallel between the measuring probe 1 and the signal source 3 of the inspection device 501 according to Embodiment 1 (see, FIG. 1). The other configuration of the inspection device 502 according to Embodiment 2 is similar to that in the inspection device 501 according to Embodiment 1, so that the same reference numerals are assigned to the corresponding parts and description thereof will be omitted.

Figure 4:
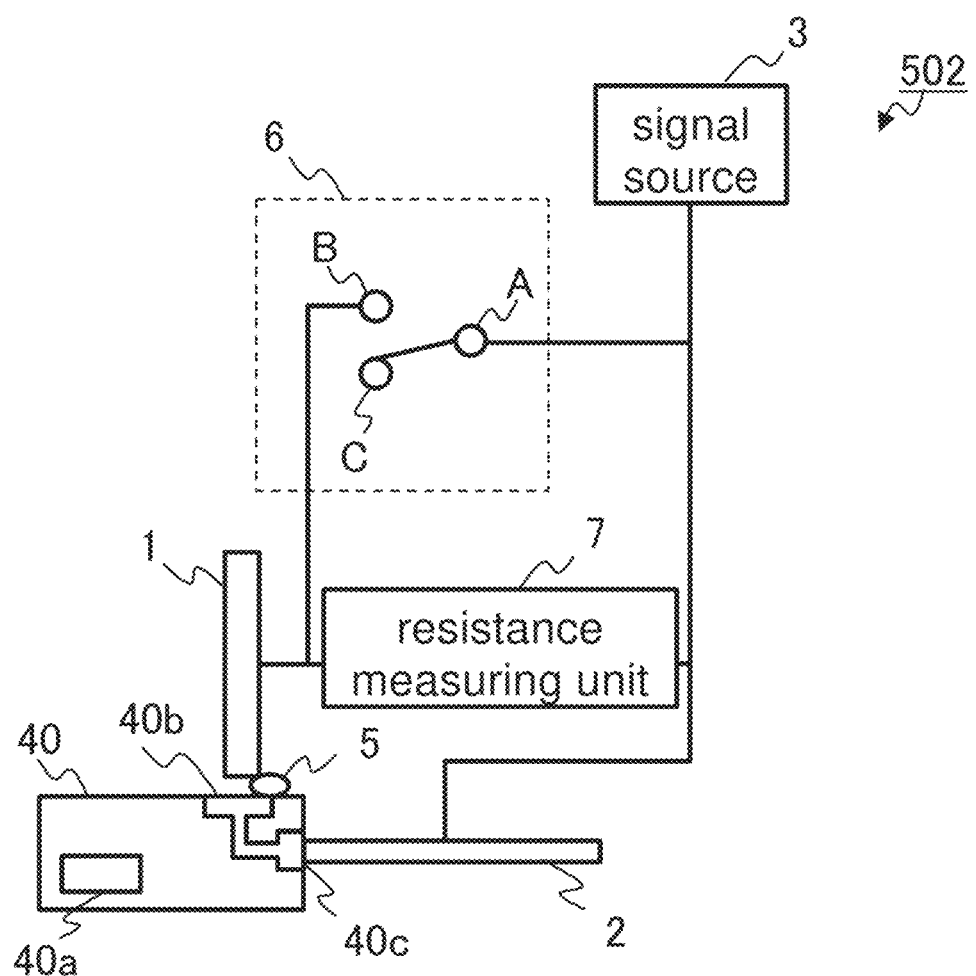
FIG. 4 is a schematic diagram showing a state in which the inspection device according to Embodiment 2 is connected to a measurement object.

FIG. 4 is a schematic diagram showing a state in which the inspection device 502 is connected to a measurement object 40. The measurement object 40 is provided with, in its inside, an OTPROM 40*a* and, on its front surface and side surface, a terminal pad 40*b* and a terminal pad 40*c*, respectively, in which the terminal pad 40*b* and the terminal pad 40*c* are provided to be electrically conductive with each other.

In the case where the condition of contact is confirmed before the inspection, as shown in FIG. 4, after the inspection device 502 is put into a state in which the terminal A of the relay 6 is connected to the terminal C thereof (the shut-off state), the measuring probe 1 and the measuring probe 2 are placed on the terminal pad 40*b* and the terminal pad 40*c*, respectively. Namely, the measuring probe 1 provided through the resistance measuring unit 7 is placed on the terminal pad 40*b*.

On this occasion, if foreign substances 5 are deposited in between the measuring probe 1 and the terminal pad 40*b*, a state is provided in which the measuring probe 1 and the terminal pad 40*b* are not connected to each other but the measuring probe 2 and the terminal pad 40*c* are connected to each other. When resistance measurement is executed in this state by using the resistance measuring unit 7, the resistance value will be more than a prescribed value, so that a defective contact can be detected. When the resistance value that is more than the prescribed value is detected, it is allowed to execute the inspection after removing the foreign substance 5, or to continue execution of the inspection only using the measuring probe 2 without removing the foreign substances 5 and then to remove the foreign substances 5 after the inspection for one lot is completed.

If the foreign substances 5 are not present, a state is provided in which the measuring probe 1 and the terminal pad 40*b* are connected to each other and the measuring probe 2 and the terminal pad 40*c* are connected to each other, so that the resistance value will be equal to or less than the prescribed value. When the resistance value is equal to or less than the prescribed value, the inspection is executed without any additional step.

In this manner, when the rely 6 and the resistance measuring unit 7 are provided in parallel between the measuring probe 1 and the signal source 3, a defective contact can be detected. This makes it possible to suppress reduction in the yield about the measurement object 40 provided with the OTPROM 40*a*.

As described above, since the relay and the resistance measuring unit are provided in parallel between the measuring probe 1 and the signal source 3, the inspection device 502 according to Embodiment 2 can detect a defective contact before the inspection, and thus can suppress reduction in the yield about the measurement object provided with the OTPROM.

Embodiment 3

In Embodiment 1 and Embodiment 2, the description has been made about a case where the measurement object 40 provided with the terminal pads 40*b* and 40*c* respectively on the front surface and the side surface, is inspected, whereas in Embodiment 3, description will be made about a case where a measurement object provided with a terminal pin on its side surface is inspected.

Figure 5:
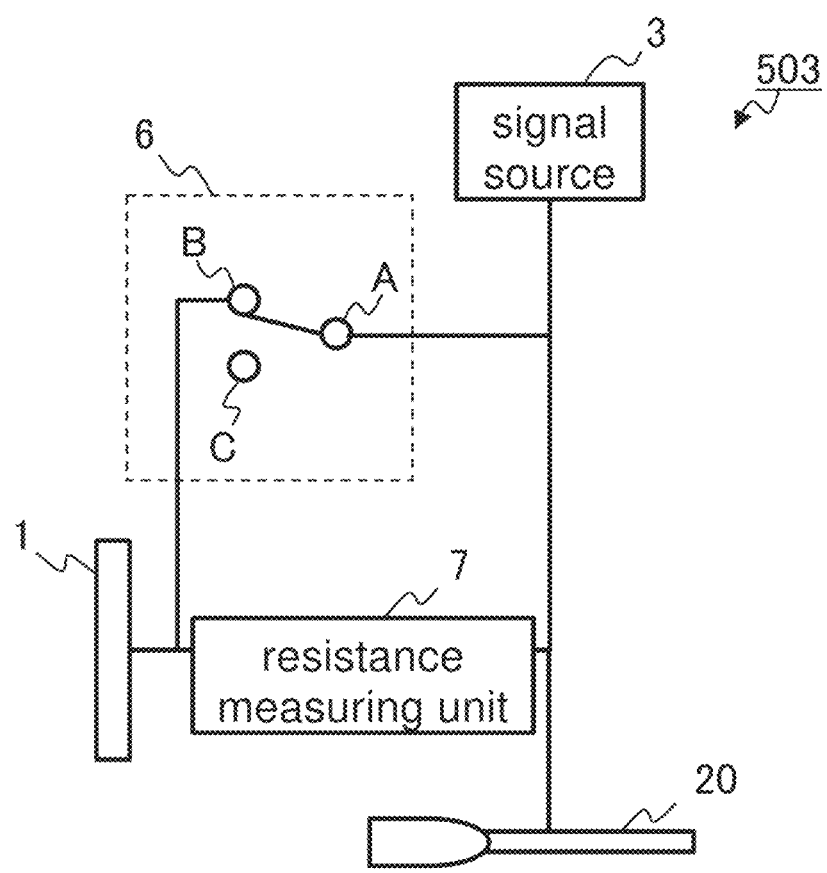
FIG. 5 is a schematic diagram showing a configuration of an inspection device according to Embodiment 3.

FIG. 5 is a schematic diagram showing a configuration of an inspection device 503 according to Embodiment 3. As shown in FIG. 5, the inspection device 503 is provided with a female-type measuring probe 20 instead of the measuring probe 2 as a male-type probe of the inspection device 502 according to Embodiment 2 (see, FIG. 3). The other configuration of the inspection device 503 according to Embodiment 3 is similar to that in the inspection device 502 according to Embodiment 2, so that the same reference numerals are assigned to the corresponding parts and description thereof will be omitted.

Figure 6:
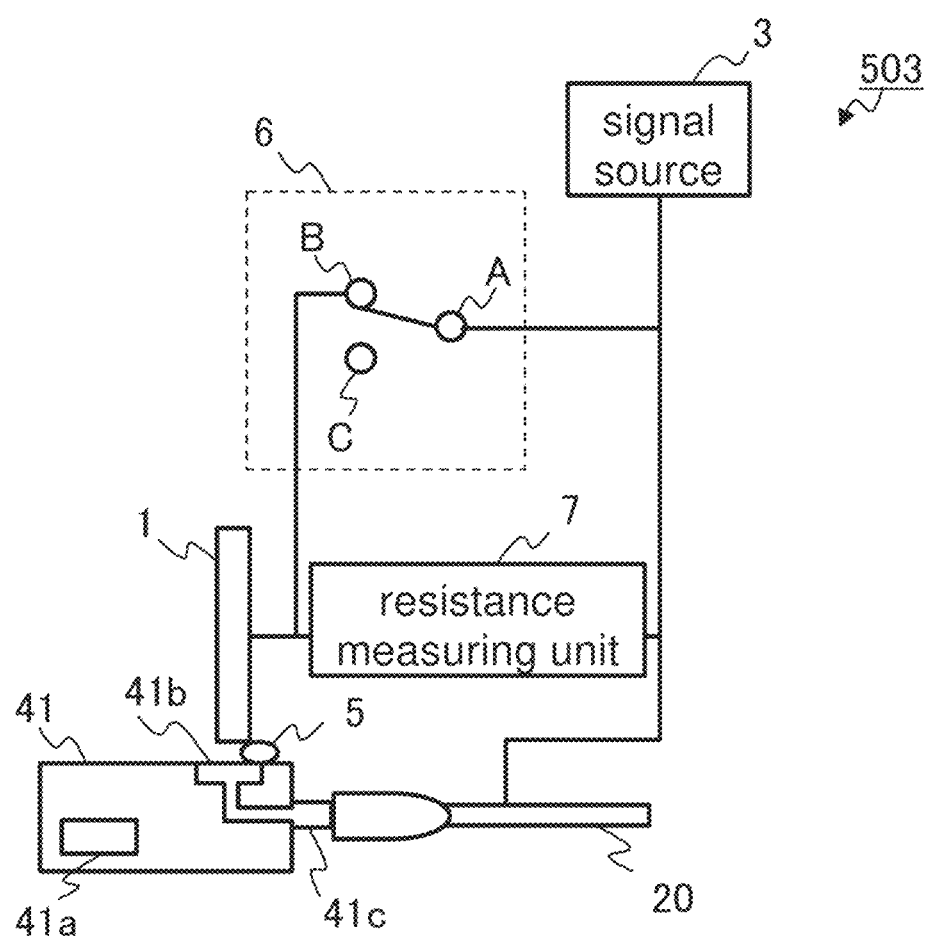
FIG. 6 is a schematic diagram showing a state in which the inspection device according to Embodiment 3 is connected to a measurement object.

FIG. 6 is a schematic diagram showing a state in which the inspection device 503 is connected to a measurement object 41. The measurement object 41 is provided with, in its inside, an OTPROM 41*a*, and on its front surface and side surface, a female-type terminal pad 41*b* and a male-type terminal pin 41*c*, respectively, in which the terminal pad 41*b* and the terminal pin 41*c* are provided to be electrically conductive with each other.

Like in Embodiment 2, in order to confirm the condition of contact before the inspection, as shown in FIG. 6, after the inspection device 503 is put into a state in which the terminal A of the relay 6 is connected to the terminal C thereof (the shut-off state), the measuring probe 1 and the measuring probe 20 are placed on the terminal pad 41*b* and the terminal pin 41*c*, respectively. Namely, the measuring probe 1 provided through the resistance measuring unit 7 is placed on the terminal pad 41*b*. Operations for detecting a defective contact before the inspection and for performing the inspection with respect to the inspection device 503 according to Embodiment 3, are similar to the operations for detecting a defective contact before the inspection and for performing the inspection with respect to the inspection device 502 according to Embodiment 2, so that description thereof will be omitted.

Even in this case, since the female-type measuring probe 20 is provided instead of the male-type measuring probe 2, a defective contact can be detected also for the measurement object 41 provided with the terminal pad 41*b* and the terminal pin 41*c*. This makes it possible to suppress reduction in the yield about the measurement object 41 provided with the OTPROM 41*a*.

As described above, since a male-type probe is used as the measuring probe 1 and a female-type probe is used as the measuring probe 20, the inspection device 503 according to Embodiment 3 can also detect a defective contact about the measurement object provided with the terminal pad and the terminal pin before its inspection, and thus can suppress reduction in the yield about the measurement object provided with the OTPROM.

Embodiment 4

In Embodiment 2 and Embodiment 3, the description has been made about a case where a defective contact due to foreign substances is detected, whereas in Embodiment 4, description will be made about a case where the foreign substances are removed.

Figure 7:
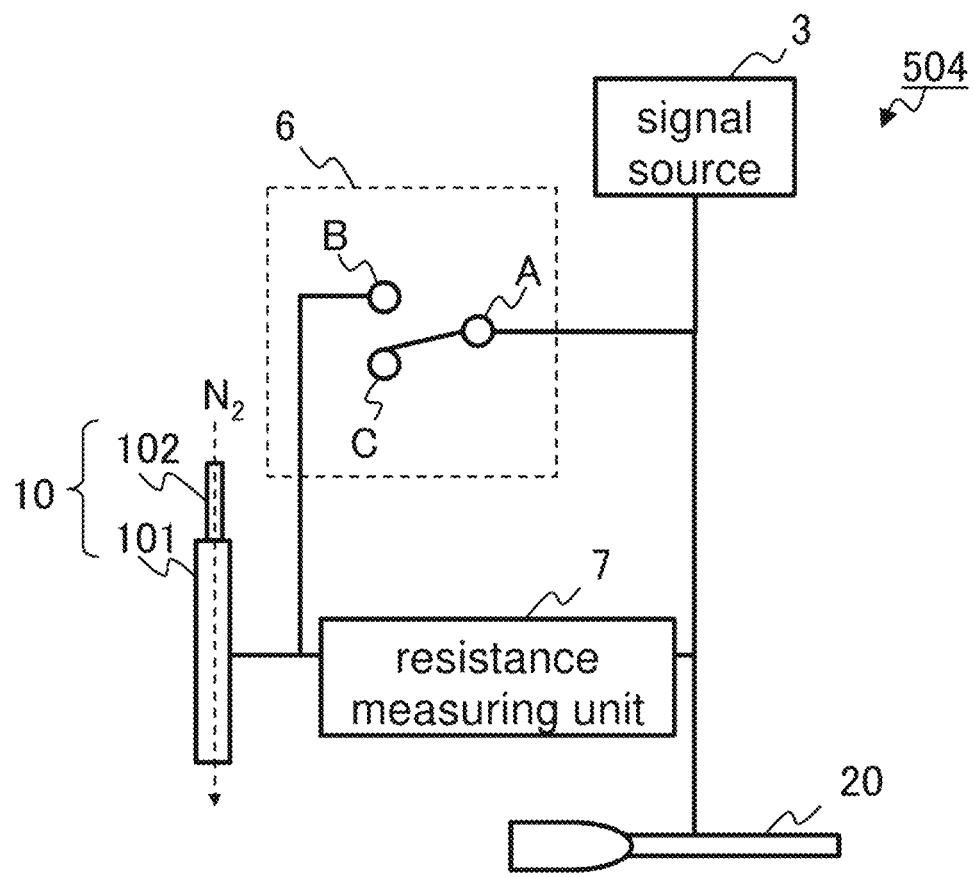
FIG. 7 is a schematic diagram showing a configuration of an inspection device according to Embodiment 4.

FIG. 7 is a schematic diagram showing a configuration of an inspection device 504 according to Embodiment 4. As shown in FIG. 7, the inspection device 504 is provided with a measuring probe 10 equipped with a nozzle 102, instead of the measuring probe 1 of the inspection device 503 according to Embodiment 3 (see, FIG. 5). The other configuration of the inspection device 504 according to Embodiment 4 is similar to that in the inspection device 503 according to Embodiment 3, so that the same reference numerals are assigned to the corresponding parts and description thereof will be omitted.

Figure 8:
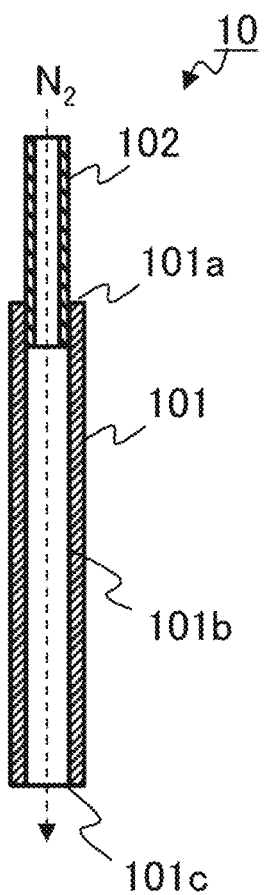
FIG. 8 is a longitudinal sectional view showing a configuration of a measuring probe in the inspection device according to Embodiment 4.

FIG. 8 is a longitudinal sectional view showing a configuration of the measuring probe 10 in the inspection device 504. As shown in FIG. 8, according to the measuring probe 10, its probe body 101 is being formed into a cylindrical shape, and nitrogen gas ($N_2$ gas) flowing in through the nozzle 102 that is inserted in an upper end portion 101a of the probe body 101, may be ejected from a head end portion 101c by using a cylindrical inner region 101b of the probe body 101 as a passage.

Figure 9:
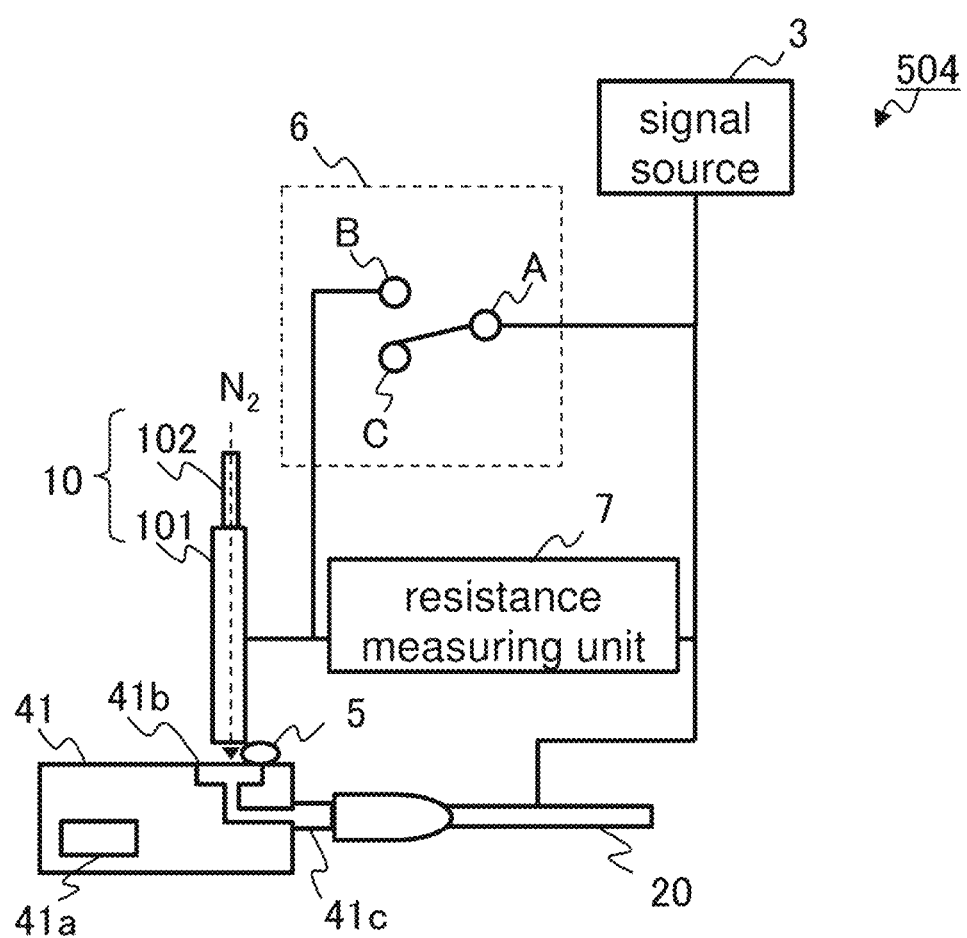
FIG. 9 is a schematic diagram showing a state in which the inspection device according to Embodiment 4 is connected to a measurement object.

FIG. 9 is a schematic diagram showing a state in which the inspection device 504 is connected to a measurement object 41. The measurement object 41 is provided with, in its inside, an OTPROM 41a and, on its front surface and side surface, a female-type terminal pad 41b and a male-type terminal pin 41c, respectively, in which the terminal pad 41b and the terminal pin 41c are provided to be electrically conductive with each other.

Like in Embodiment 2, in order to confirm the condition of contact before the inspection, as shown in FIG. 9, after the inspection device 504 is put into a state in which the terminal A of the relay 6 is connected to the terminal C thereof (the shut-off state), the measuring probe 10 and the measuring probe 20 are placed on the terminal pad 41b and the terminal pin 41c, respectively. Namely, the measuring probe 10 provided through the resistance measuring unit 7 is placed on the terminal pad 41b.

In Embodiment 4, if foreign substances 5 are deposited in between the measuring probe 10 and the terminal pad 41b, upon detection of such a defective contact by the resistance measuring unit the inspection device 504 ejects the nitrogen gas toward the terminal pad 41b to thereby remove the foreign substances 5 from around the head end portion 101c of the measuring probe 10 until it gets connected to the terminal pad.

After the removal of the foreign substances 5, the measuring probe 10 and the terminal pad 41b get connected to each other, so that the inspection device 504 stops ejecting the nitrogen gas. Accordingly, the measuring probe 10 and the measuring probe 20 are put into a state in which they are connected to the terminal pad 41b and the terminal pin 41c, respectively, so that the inspection is executed without any additional step.

In this manner, since the measuring probe 10 equipped with the nozzle 102 is provided, it is possible not only to detect a defective contact, but also to remove the foreign substances 5 by ejecting the nitrogen gas from the head end portion of the measuring probe 10, and thus an effect is created that reduces the defective contact. Further, since the nitrogen gas is used, an effect is created that prevents the measuring probe 10 and the terminal pad 41b from being oxidized. In addition, it is possible to suppress reduction in the yield about the measurement object 41 provided with the OTPROM 41a.

As described above, since the measuring probe 10 equipped with the nozzle 102 is provided, the inspection device 504 according to Embodiment 4 can not only achieve an effect similar to that in Embodiment 3 but also can remove the foreign substances by ejecting the nitrogen gas from the head end portion of the measuring probe, so that an effect is created that reduces the defective contact. Further, since the nitrogen gas is used, an effect is created that prevents the measuring probe and the terminal pad from being oxidized.

Figure 10:
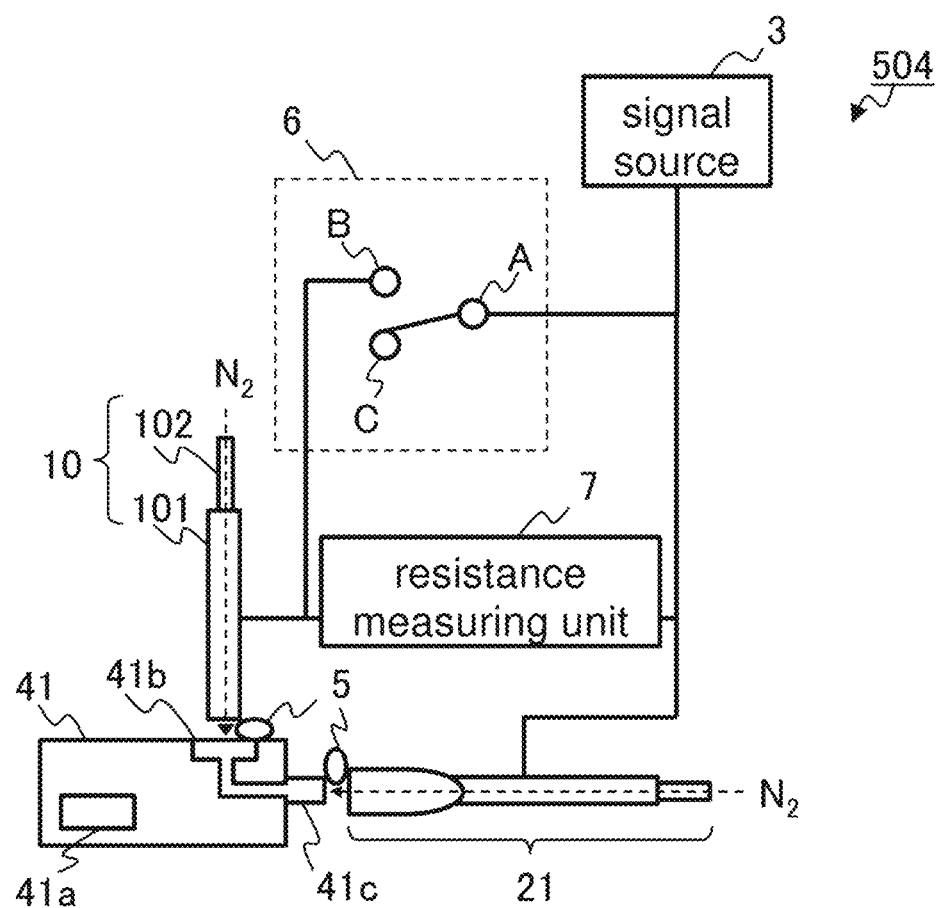
FIG. 10 is a schematic diagram showing a configuration of another inspection device according to Embodiment 4.

It is noted that in Embodiment 4, the nozzle 102 is provided in the measuring probe 10; however, this is not limitative. As shown in FIG. 10, the nozzle may also be provided in a measuring probe 21 so that foreign substance 5 in between the measuring probe 21 and the terminal pin 41c are removed.

Embodiment 5

In Embodiment 4, the description has been made about a case where nitrogen gas is ejected to remove the foreign substances, whereas in Embodiment 5, a case will be described where ions are ejected together with the nitrogen gas.

Figure 11:
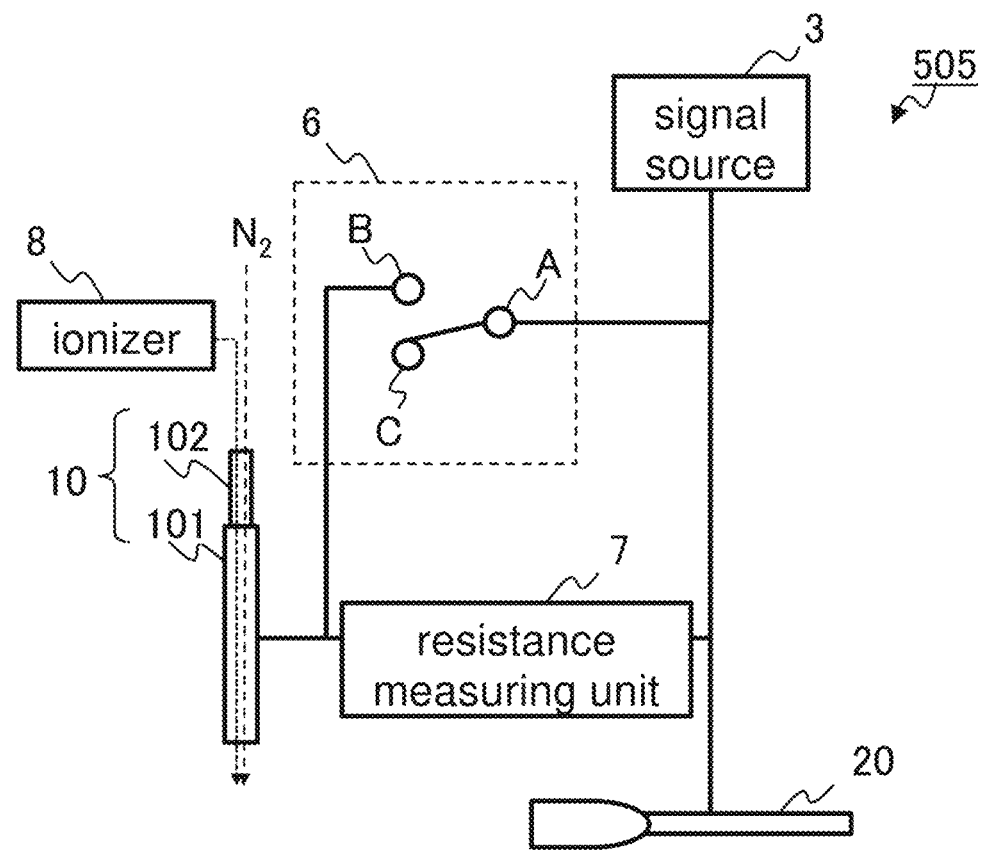
FIG. 11 is a schematic diagram showing a configuration of an inspection device according to Embodiment 5.

FIG. 11 is a schematic diagram showing a configuration of an inspection device 505 according to Embodiment 5. As shown in FIG. 11, in the inspection device 505, the cylindrical measuring probe 10 according to Embodiment 4 is further provided with an ionizer 8, so that ions may be ejected together with the nitrogen gas from the head end portion through the cylindrical inner region of the measuring probe 10. The other configuration of the inspection device 505 according to Embodiment 5 is similar to that in the inspection device 504 according to Embodiment 4, so that the same reference numerals are assigned to the corresponding parts and description thereof will be omitted.

Figure 12:
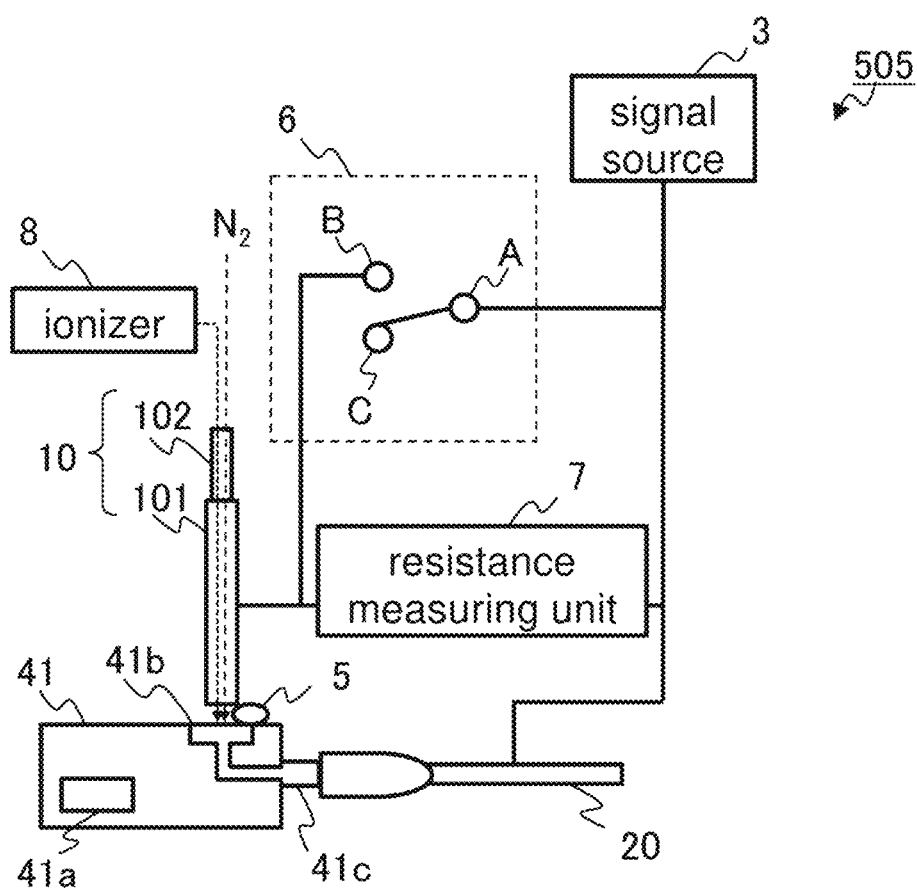
FIG. 12 is a schematic diagram showing a state in which the inspection device according to Embodiment 5 is connected to a measurement object.

FIG. 12 is a schematic diagram showing a state in which the inspection device 505 is connected to a measurement object 41. The measurement object 41 is provided with, in its inside, an OTPROM 41a and, on its front surface and side surface, a female-type terminal pad 41b and a male-type terminal pin 41c, respectively, in which the terminal pad 41b and the terminal pin 41c are provided to be electrically conductive with each other.

Like in Embodiment 2, in order to confirm the condition of contact before the inspection, as shown in FIG. 12, after the inspection device 505 is put into a state in which the terminal A of the relay 6 is connected to the terminal C thereof (the shut-off state), the measuring probe 10 and the measuring probe 20 are placed on the terminal pad 41b and the terminal pin 41c, respectively. Namely, the measuring probe 10 provided through the resistance measuring unit 7 is placed on the terminal pad 41b.

In Embodiment 5, if foreign substances 5 are deposited in between the measuring probe 10 and the terminal pad 41b, upon detection of such a defective contact by the resistance measuring unit 7, the inspection device 505 ejects the ions together with the nitrogen gas toward the terminal pad 41b from the head end portion of the measuring probe 10 until it gets connected to the terminal pad, to thereby remove the foreign substances 5 while making it difficult for any foreign substance to come close.

After the removal of the foreign substances 5, the measuring probe 10 and the terminal pad 41b get connected to each other, so that the inspection device 505 stops ejecting the nitrogen gas and the ions. Accordingly, the measuring probe 10 and the measuring probe 20 are put into a state in which they are connected to the terminal pad 41b and the terminal pin 41c, respectively, so that the inspection is executed without any additional step.

In this manner, since the measuring probe 10 is provided with the ionizer 8, it is possible not only to detect a defective contact, but also to prevent electrostatic damage of the measurement object by ejecting ions from the head end portion of the measuring probe 10, together with nitrogen gas, to remove the foreign substances 5. Further, it is possible to suppress reduction in the yield about the measurement object 41 provided with the OTPROM 41a.

As described above, since the measuring probe 10 is provided with the ionizer 8, the inspection device 505 according to Embodiment 5 can not only achieve an effect similar to that in Embodiment 4 but also can remove the foreign substances and prevent electrostatic damage of the measurement object by ejecting ions together with nitrogen gas from the head end portion of the measuring probe.

Figure 13:
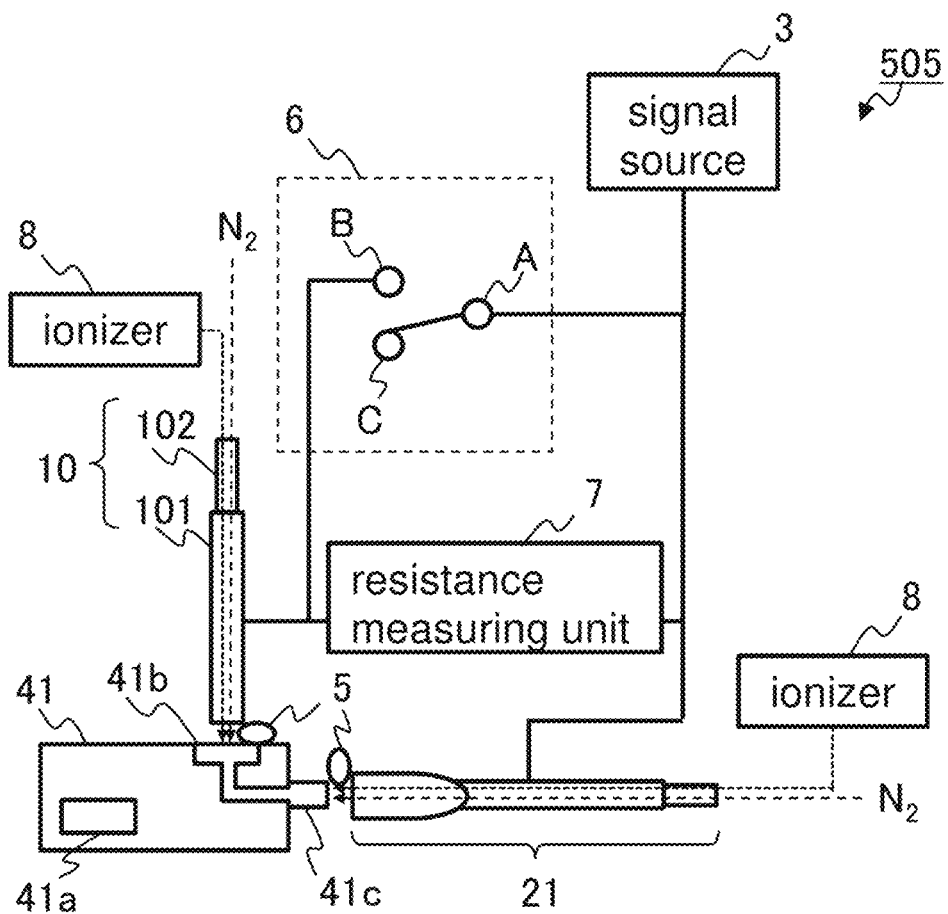
FIG. 13 is a schematic diagram showing a configuration of another inspection device according to Embodiment 5.

It is noted that in Embodiment 5, ions are ejected together with nitrogen gas from the measuring probe 10; however, this is not limitative. As shown in FIG. 13, ions may be ejected together with nitrogen gas also from the measuring probe 21 so that foreign substance 5 in between the measuring probe 21 and the terminal pin 41c are removed.

Embodiment 6

In Embodiment 4 and Embodiment 5, the description has been made about a case where nitrogen gas is ejected to remove the foreign substances, whereas in Embodiment 6, a case will be described where the foreign substances are removed by using a rotating mechanism.

Figure 14:
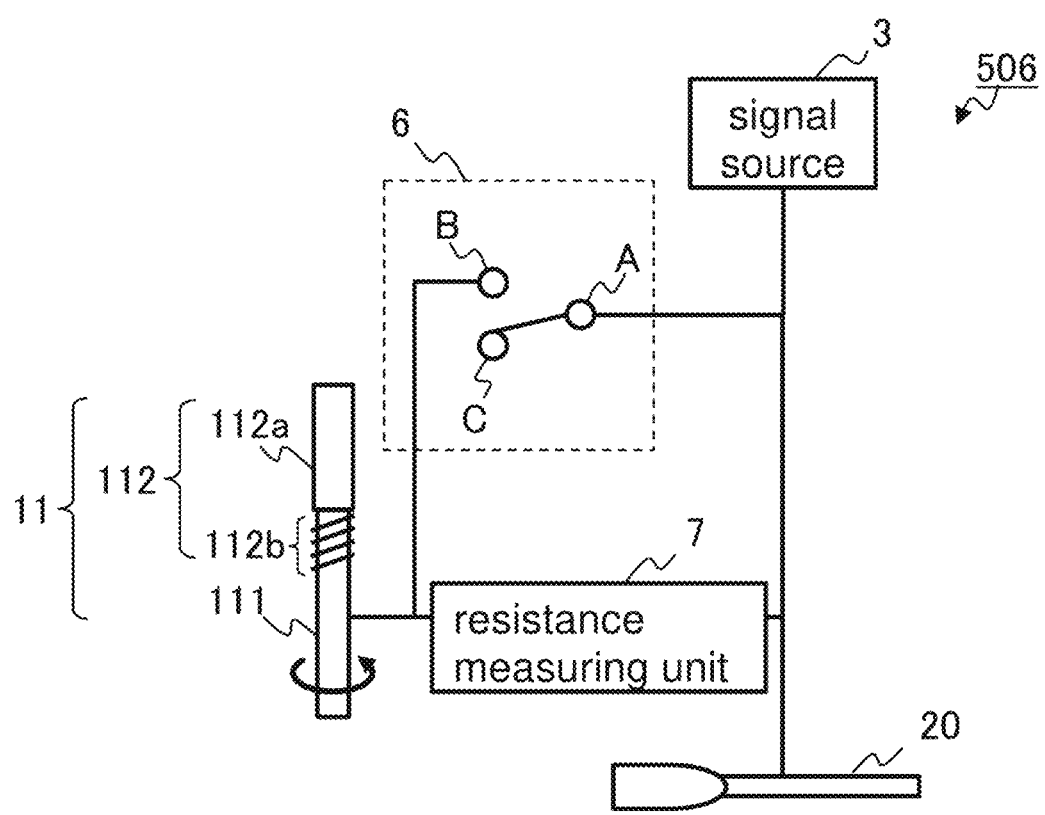
FIG. 14 is a schematic diagram showing a configuration of an inspection device according to Embodiment 6.

FIG. 14 is a schematic diagram showing a configuration of an inspection device 506 according to Embodiment 6. As shown in FIG. 14, the inspection device 506 is provided with a measuring probe 11 equipped with a rotating mechanism 112, instead of the measuring probe 10 of the inspection device 504 according to Embodiment 4 (see, FIG. 7). The other configuration of the inspection device 506 according to Embodiment 6 is similar to that in the inspection device 503 according to Embodiment 3, so that the same reference numerals are assigned to the corresponding parts and description thereof will be omitted.

Figure 15A:
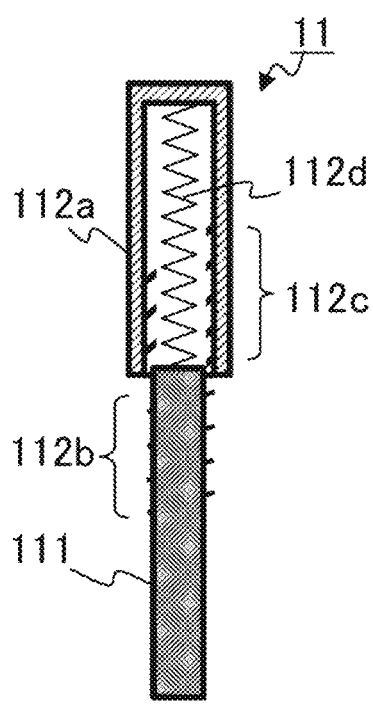
FIG. 15A and FIG. 15B are a set of longitudinal sectional views showing a configuration of a measuring probe in the inspection device according to Embodiment 6.

FIG. 15A is a longitudinal sectional view showing a configuration of the measuring probe 11 in the inspection device 506. As shown in FIG. 15A, in the measuring probe 11, a rotating mechanism body 112a and a male screw portion 112b are provided at an upper end portion of a probe body 111. The rotating mechanism body 112a has a cap shape, and on its inner side surface, a female screw portion 112c is provided, and on its inner top surface, a spring 112d is provided so as to push out the probe body 111. The female screw portion 112c provided on the rotating mechanism body 112a and the male screw portion 112b provided on the probe body 111 are formed so that their respective screw threads are to be coupled to each other in a screwed manner.

Figure 15B:
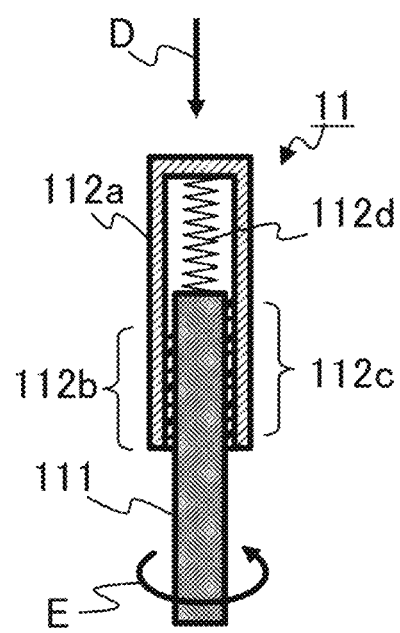

FIG. 15B is a longitudinal sectional view showing a state in which the probe body 111 is pushed in the rotating mechanism body 112a. When the head end portion of the measuring probe 11 is placed on the pad and the rotating mechanism body 112a in the measuring probe 11 is pressed in a downward direction (D direction) as shown in FIG. 15B, the probe body 111 will rotate in an E direction while the male screw portion 112b is being screwed in the female screw portion 112c of the rotating mechanism body 112a. In Embodiment 6, foreign substances that may exist in between the probe body 111 and the terminal pad will be removed by the rotation of that probe body.

Thereafter, the pressing force toward the rotating mechanism body 112a is released, so that, in the measuring probe 11, because of the elastic force of the spring 112d, the probe body 111 will be pushed out from the rotating mechanism body 112a while the male screw portion 112b of the probe body 111 is being screwed out of the female screw portion 112c of the rotating mechanism body 112a.

Figure 16:
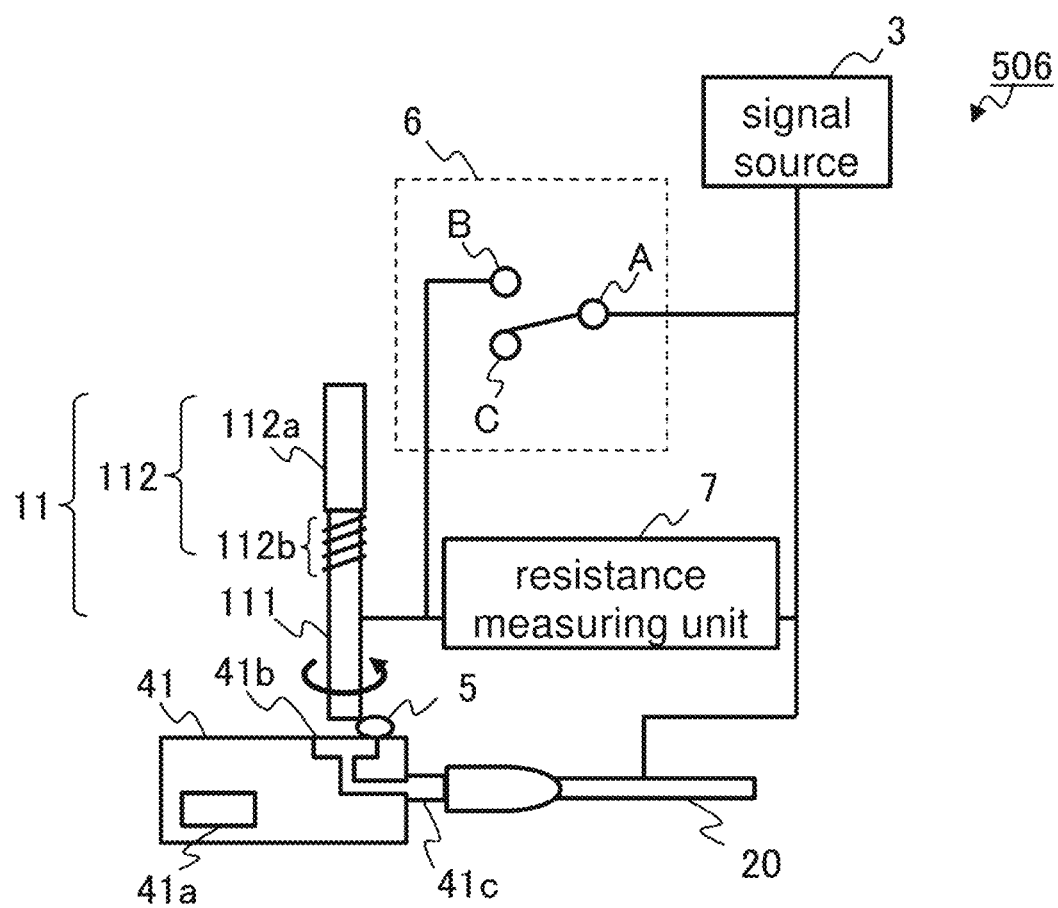
FIG. 16 is a schematic diagram showing a state in which the inspection device according to Embodiment 6 is connected to a measurement object.

FIG. 16 is a schematic diagram showing a state in which the inspection device 506 is connected to a measurement object 41. The measurement object 41 is provided with, in its inside, an OTPROM 41a and, on its front surface and side surface, a female-type terminal pad 41b and a male-type terminal pin 41c, respectively, in which the terminal pad 41b and the terminal pin 41c are provided to be electrically conductive with each other.

Like in Embodiment 2, in order to confirm the condition of contact before the inspection, as shown in FIG. 16, after the inspection device 506 is put into a state in which the terminal A of the relay 6 is connected to the terminal C thereof (the shut-off state), the measuring probe 11 and the measuring probe 20 are placed on the terminal pad 41b and the terminal pin 41c, respectively. Namely, the measuring probe 11 provided through the resistance measuring unit 7 is placed on the terminal pad 41b.

In Embodiment 6, if foreign substances 5 are deposited in between the measuring probe 11 and the terminal pad 41b, upon detection of such a defective contact by the resistance measuring unit 7, the inspection device 506 presses the rotating mechanism body 112a in the downward direction to thereby rotate the probe body 111, so that the foreign substances 5 are removed from around the head end portion of the measuring probe 11.

After the removal of the foreign substances 5, the measuring probe 11 and the terminal pad 41b get connected to each other. Thus, the measuring probe 11 and the measuring probe 20 are put into a state in which they are connected to the terminal pad 41b and the terminal pin 41c, respectively, so that the inspection is executed without any additional step.

In this manner, since the measuring probe 11 is provided with the rotating mechanism 112, it is possible not only to detect a defective contact, but also to prevent electrostatic damage of the measurement object when the foreign substances 5 are removed by the rotation of the probe body 111. Further, it is possible to suppress reduction in the yield about the measurement object 41 provided with the OTPROM 41a.

As described above, since the measuring probe 11 has the rotating mechanism 112 and is thus configured to rotate around a in a direction perpendicular to the surface of the terminal pad 41b where the measuring probe 11 is to be connected to that pad, the inspection device 506 according to Embodiment 6 can not only achieve an effect similar to that in Embodiment 4 but also can cause the probe body 111 to rotate, thereby to remove the foreign substances as well as to prevent electrostatic damage of the measurement object.

Figure 17:
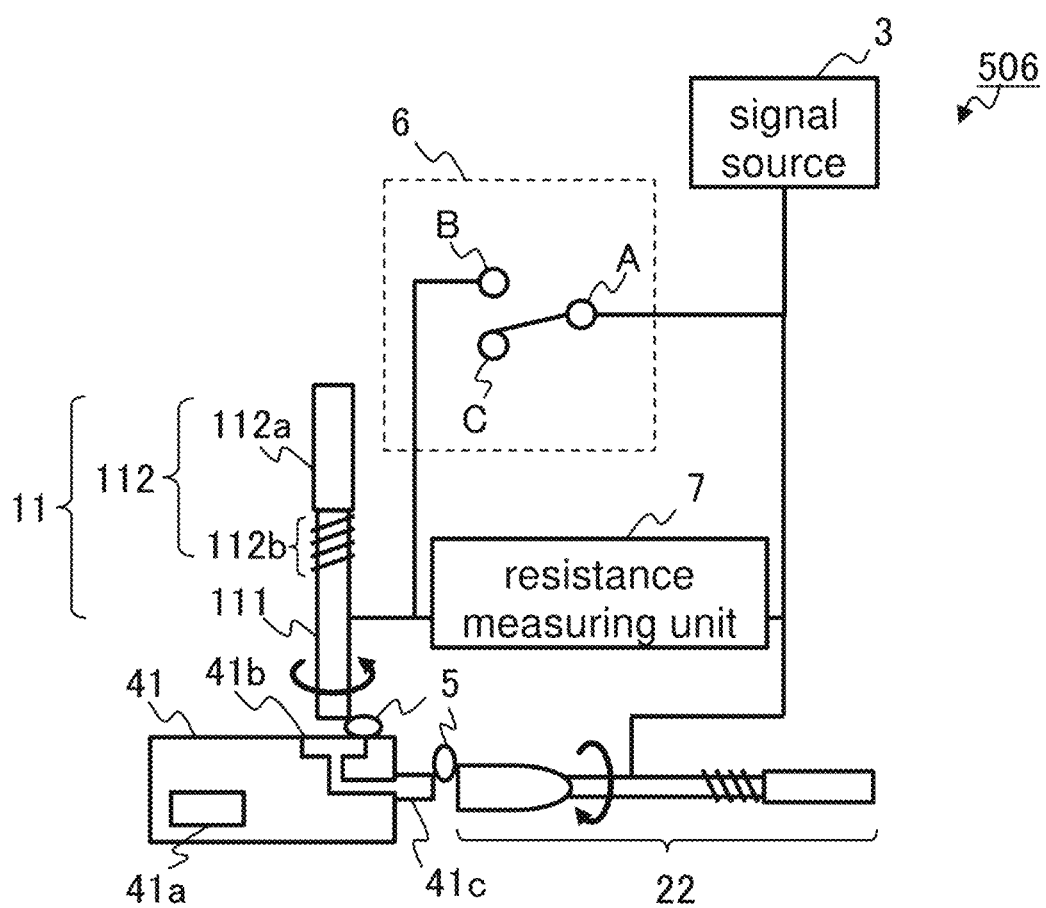
FIG. 17 is a schematic diagram showing a configuration of another inspection device according to Embodiment 6.

It is noted that in Embodiment 6, the rotating mechanism 112 is provided in the measuring probe 11; however, this is not limitative. As shown in FIG. 17, the rotation mechanism 112 may also be provided in a measuring probe 22 so that foreign substance 5 in between the measuring probe 22 and the terminal pin 41c are removed.

Figure 18:
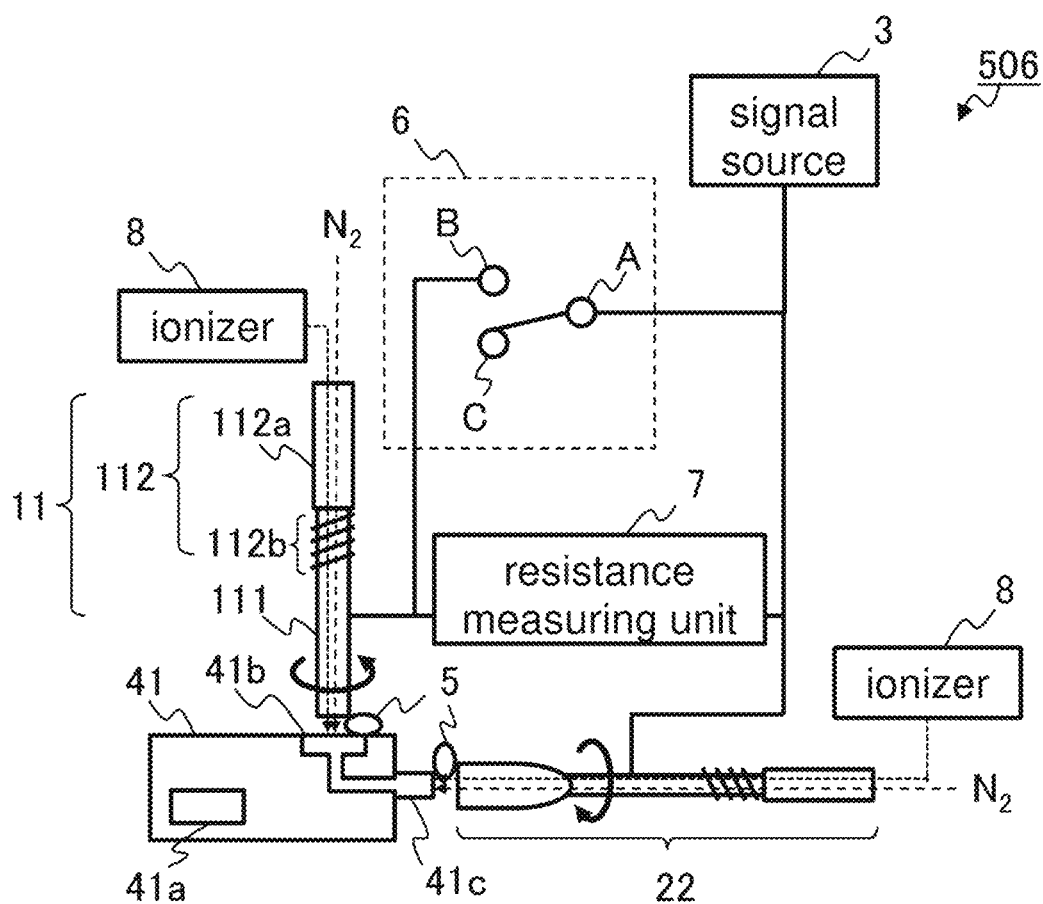
FIG. 18 is a schematic diagram showing a configuration of another inspection device according to Embodiment 6.
Figure 19A:
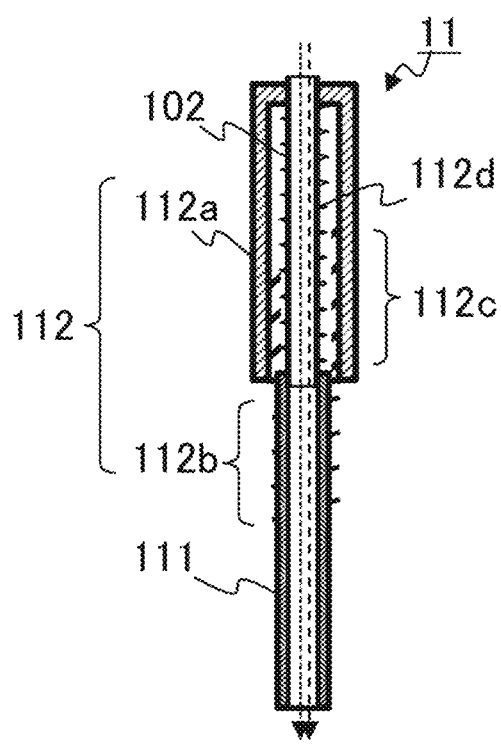
FIG. 19A and FIG. 19B are a set of longitudinal sectional views showing a configuration of another measuring probe in the inspection device according to Embodiment 6.
Figure 19B:
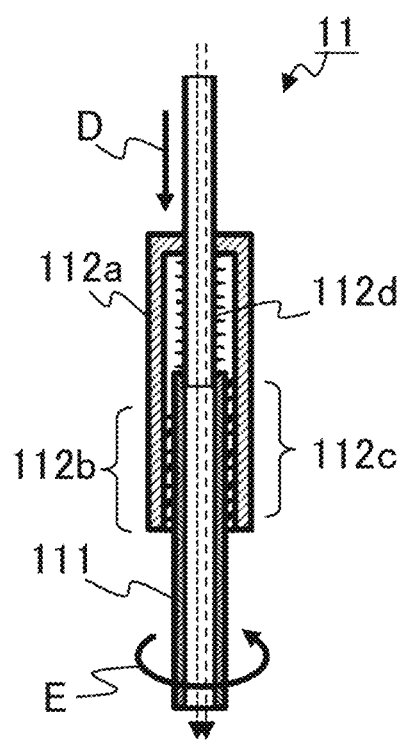

Further, in Embodiment 6, the measuring probe 11 is merely provided with the rotating mechanism 112; however, this is not limitative. As shown in FIG. 18, the measuring probe 11 provided with the rotating mechanism 112 may also be configured to eject nitrogen gas and ions as described in Embodiment 5. In FIG. 19A, a longitudinal sectional view of the measuring probe 11 equipped with the rotating mechanism 112 and the nozzle 102 is shown, provided that, in the measuring probe 11 equipped with the rotating mechanism 112 and the nozzle 102, the nozzle 102 passes through the central region of a spring section 112d composed of a coil spring, to get inserted in the upper end portion of the probe body 111 formed in a cylindrical shape. As shown in FIG. 19B, the measuring probe 11 causes the probe body 111 to rotate, while ejecting from the head end portion thereof, nitrogen gas and ions flowing in through the nozzle 102, to thereby remove the foreign substances.

Figure 20A:
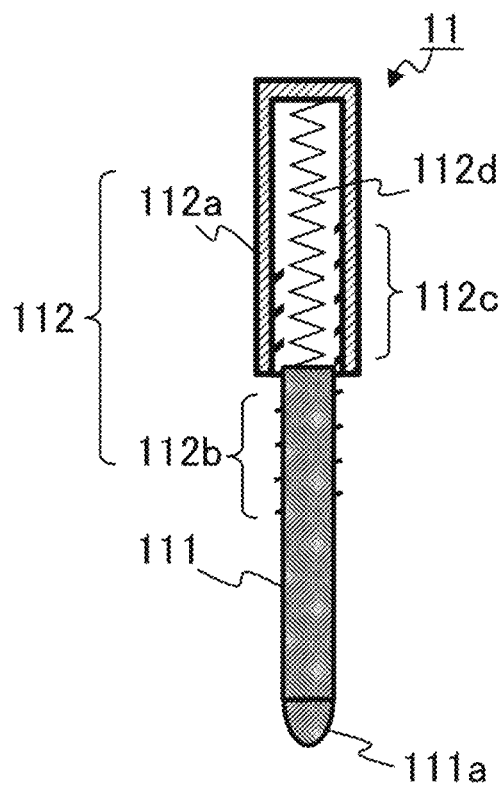
FIG. 20A and FIG. 20B are a set of longitudinal sectional views showing a configuration of another measuring probe in the inspection device according to Embodiment 6.
Figure 20B:
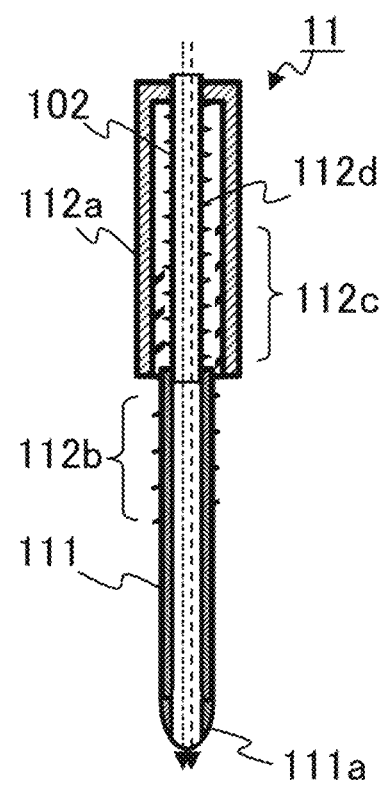

Further, in Embodiment 6, a probe whose head end portion is flat is used as the measuring probe 11; however, this is not limitative. As shown in FIG. 20A and FIG. 20B, a semispherical probe may be used. Since a head end portion 111a of the measuring probe 11 is semispherical, at the time of rotation thereof, it becomes easier to push out the foreign substances to the outside.

In this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where at least one configuration element is added or omitted; and furthermore, where at least one configuration element is extracted and combined with a configuration element of another embodiment.

DESCRIPTION OF REFERENCE NUMERALS AND SIGNS 1, 2, 10, 11, 20, 21, 22: measuring probe, 3: signal source, 40, 41: measurement object, 40b, 40c, 41b: terminal pad, 41c: terminal pin, 501, 502, 503, 504, 505, 506: inspection device.

The invention claimed is:

1. An inspection device, comprising:
a first probe that is to be connected to a first terminal portion of a measurement object;
a second probe that is to be connected to a second terminal portion of the measurement object, said second terminal portion being electrically conductive with the first terminal portion of the measurement object; and
a signal source that is connected to both the first probe and the second probe and that can write or read a signal in or from the measurement object through each of the first probe and the second probe;
wherein the first probe has a cylindrical shape, and a gas may be ejected from a head end portion of the first probe through an inner region of the cylindrical shape thereof; and
wherein the first probe is provided with an ionizer, so that ions may be ejected, together with the gas, from the head end portion of the first probe through the inner region of the cylindrical shape thereof.

2. The inspection device as set forth in claim 1, wherein a relay and a resistance measuring unit are connected in parallel between the first probe and the signal source.

3. The inspection device as set forth in claim 2, wherein a male-type probe is used as the first probe and a female-type probe is used as the second probe.

4. The inspection device as set forth in claim 2, wherein the second probe has a cylindrical shape, and a gas may be ejected from a head end portion of the second probe through an inner region of the cylindrical shape thereof.

5. The inspection device as set forth in claim 2, wherein the second probe is provided with an ionizer, so that ions may be ejected, together with the gas, from the head end portion of the second probe through the inner region of the cylindrical shape thereof.

6. The inspection device as set forth in claim 2, wherein the first probe has a rotating mechanism, so that the first probe may rotate around a rotation axis in a direction perpendicular to a surface of the first terminal portion where said first probe is to be connected to that portion.

7. The inspection device as set forth in claim 1, wherein a male-type probe is used as the first probe and a female-type probe is used as the second probe.

8. The inspection device as set forth in claim 7, wherein the second probe has a cylindrical shape, and a gas may be ejected from a head end portion of the second probe through an inner region of the cylindrical shape thereof.

9. The inspection device as set forth in claim 7, wherein the second probe is provided with an ionizer, so that ions may be ejected, together with the gas, from the head end portion of the second probe through the inner region of the cylindrical shape thereof.

10. The inspection device as set forth in claim 7, wherein the first probe has a rotating mechanism, so that the first probe may rotate around a rotation axis in a direction perpendicular to a surface of the first terminal portion where said first probe is to be connected to that portion.

11. The inspection device as set forth in claim 1, wherein the second probe has a cylindrical shape, and a gas may be ejected from a head end portion of the second probe through an inner region of the cylindrical shape thereof.

12. The inspection device as set forth in claim 11, wherein the second probe is provided with an ionizer, so that ions may be ejected, together with the gas, from the head end portion of the second probe through the inner region of the cylindrical shape thereof.

13. The inspection device as set forth in claim 11, wherein the first probe has a rotating mechanism, so that the first probe may rotate around a rotation axis in a direction perpendicular to a surface of the first terminal portion where said first probe is to be connected to that portion.

14. The inspection device as set forth in claim 1, wherein the second probe is provided with an ionizer, so that ions may be ejected, together with the gas, from the head end portion of the second probe through the inner region of the cylindrical shape thereof.

15. The inspection device as set forth in claim 14, wherein the first probe has a rotating mechanism, so that the first probe may rotate around a rotation axis in a direction perpendicular to a surface of the first terminal portion where said first probe is to be connected to that portion.

16. The inspection device as set forth in claim 1, wherein the first probe has a rotating mechanism, so that the first probe may rotate around a rotation axis in a direction perpendicular to a surface of the first terminal portion where said first probe is to be connected to that portion.

17. The inspection device as set forth in claim 16, wherein the second probe has a rotating mechanism, so that the second probe may rotate around a rotation axis in a direction perpendicular to a surface of the second terminal portion where said second probe is to be connected to that portion.

18. The inspection device as set forth in claim 17, wherein the head end portion of the first probe is semispherical.

19. The inspection device as set forth in claim 16, wherein the head end portion of the first probe is semispherical.

* * * * *